(12) United States Patent
Bang et al.

(10) Patent No.: US 12,289,968 B2
(45) Date of Patent: Apr. 29, 2025

(54) DISPLAY DEVICE

(71) Applicant: Samsung Display Co., LTD., Yongin-si (KR)

(72) Inventors: Ki Ho Bang, Hwaseong-si (KR); Seung Hwan Cho, Yongin-si (KR); Eun Hye Kim, Namyangju-si (KR); Seong Ryong Lee, Hwaseong-si (KR); Eun Ae Jung, Hwaseong-si (KR); Won Suk Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 525 days.

(21) Appl. No.: 17/704,035

(22) Filed: Mar. 25, 2022

(65) Prior Publication Data
US 2022/0415995 A1    Dec. 29, 2022

(30) Foreign Application Priority Data
Jun. 24, 2021   (KR) .......................... 10-2021-0082013

(51) Int. Cl.
*H10K 59/131* (2023.01)
*G09G 3/3233* (2016.01)
*H10K 77/10* (2023.01)
*H10K 102/00* (2023.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0861* (2013.01); *G09G 2330/04* (2013.01); *H10K 77/111* (2023.02); *H10K 2102/311* (2023.02)

(58) Field of Classification Search
CPC .............. H10K 59/131; H10K 77/111; H10K 2102/311; H10K 50/844; H10K 59/122; H10K 59/124; G09G 3/3233; G09G 2300/0426; G09G 2300/0819; G09G 2300/0861; G09G 2330/04; G09G 2300/0408; G09G 2300/0421; G09G 2300/08; G09G 2310/0286; G09G 3/20; G09G 3/3241; G09G 2300/0469
See application file for complete search history.

(56) References Cited

U.S. PATENT DOCUMENTS 10,825,885 B2   11/2020   Moon et al.
10,879,319 B2   12/2020   Bang et al.
10,978,447 B2    4/2021   Kim et al.
(Continued)

FOREIGN PATENT DOCUMENTS

EP          3624197       3/2020
KR       2019-0093228     8/2019
(Continued)

*Primary Examiner* — Mark W Tornow
(74) *Attorney, Agent, or Firm* — KILE PARK REED & HOUTTEMAN PLLC

(57) ABSTRACT

A display device includes a substrate, one or more scan stages disposed on the substrate, a first conductive layer disposed on the substrate, and scan control lines electrically connected to each of the one or more scan stages, a first organic insulating layer disposed on the first conductive layer, and a second organic insulating layer disposed on the first organic insulating layer. The first organic insulating layer and the second organic insulating layer overlap the scan control lines.

21 Claims, 11 Drawing Sheets

(56) References Cited

U.S. PATENT DOCUMENTS

| | | | | |
|---|---|---|---|---|
| 2015/0001500 | A1* | 1/2015 | Sung | H10K 59/8722 |
| | | | | 257/40 |
| 2017/0330921 | A1* | 11/2017 | Lee | H10K 71/00 |
| 2018/0033998 | A1* | 2/2018 | Kim | H10K 59/12 |
| 2019/0318693 | A1* | 10/2019 | Jung | G09G 3/3266 |
| 2020/0058729 | A1 | 2/2020 | Jung et al. | |
| 2020/0111857 | A1* | 4/2020 | Moon | H10K 59/8722 |
| 2021/0083013 | A1 | 3/2021 | Bang et al. | |

FOREIGN PATENT DOCUMENTS

| | | |
|---|---|---|
| KR | 2020-0021188 | 2/2020 |
| KR | 2020-0039904 | 4/2020 |

\* cited by examiner

DISPLAY DEVICE

CROSS-REFERENCE TO RELATED APPLICATION

This application claims priority from and the benefit of Korean Patent Application No. 10-2021-0082013, filed on Jun. 24, 2021, which is hereby incorporated by reference for all purposes as if fully set forth herein.

BACKGROUND

Field

Embodiments of the invention relate generally to a display device.

Discussion of the Background

With the advancement of the information age, the demand for a display device for displaying an image has increased, with such displays used in various forms. For example, a display device has been applied to various electronic devices such as smart phones, digital cameras, notebook computers, navigation devices, and smart televisions.

Various types of display devices, such as a liquid crystal display (LCD) and an organic light emitting display (OLED), have been used as display devices. Among them, the organic light emitting display device displays an image by using an organic light emitting element that generates light by recombination of electrons and holes. An organic light emitting display device includes a plurality of transistors that provide a driving current to the organic light emitting element.

An organic light emitting display device includes pixels connected to scan lines and data lines, a scan driver for applying scan signal to the scan lines, a data driver for applying data voltages to the data lines, and a power voltage line for applying a power voltage to the pixels. The scan driver may generate scan signals in accordance with scan driving signals input through scan driving lines, and output the generated scan signals to the scan lines.

The above information disclosed in this Background section is only for understanding of the background of the inventive concepts, and, therefore, it may contain information that does not constitute prior art.

SUMMARY

Devices constructed according to illustrative implementations of the invention are capable of suppressing or avoiding a short between one or more components.

Inventive concepts consistent with at least one embodiment of the invention provide for a display device that may suppress or avoid a short between a power voltage line and a scan driving line in an area where the power voltage line and the scan driving line overlap each other.

Additional features of the inventive concepts will be set forth in the description that follows, and in part will be apparent from the description, or may be learned by practice of the inventive concepts.

According to an embodiment, a display device comprises a substrate, one or more scan stages disposed on the substrate, a first conductive layer disposed on the substrate, and that includes a plurality of scan control lines electrically connected to each of the one or more scan stages, a first organic insulating layer disposed on the first conductive layer, and a second organic insulating layer disposed on the first organic insulating layer. The first organic insulating layer and the second organic insulating layer overlap the scan control lines.

The display device may further comprising a power voltage line disposed on the second organic insulating layer and overlapping the scan stages. The first organic insulating layer and the second organic insulating layer may be disposed between the power voltage line and the plurality of scan stages.

The first organic insulating layer and the second organic insulating layer, which are disposed between the power voltage line and the plurality of scan stages, may have a first thickness that is within the range of 0.9 μmμm to 1.7 μm.

The display device may further comprise a third organic insulating layer disposed on the second organic insulating layer, and an anode electrode disposed on the third organic insulating layer. The power voltage line may include the same material as that of the anode electrode.

The display device may further comprise a pixel defining layer disposed on the anode electrode while exposing the anode electrode, a light emitting layer disposed on the anode electrode exposed by the pixel defining layer, and a cathode electrode disposed on the light emitting layer.

The display device may further comprise a second conductive layer disposed on the second organic insulating layer. The scan control line may comprise a first scan control line comprised of the first conductive layer, and a second scan control line including a first deposited conductive layer comprised of the first conductive layer and a second deposited conductive layer comprised of the second conductive layer.

The display device may further comprise a third organic insulating layer disposed on the second conductive layer, and a power voltage line disposed on the third organic insulating layer and overlapping the second scan control line. The third organic insulating layer may overlap the second scan control line. The second organic insulating layer and the third organic insulating layer may be disposed between the second scan control line and the power voltage line.

The second organic insulating layer and the third organic insulating layer, which are disposed between the power voltage line and the second scan control line, may have a second thickness that is within the range of 0.6 μm to 1.4 μm.

The display device may further comprise an etch stop pattern disposed on the second organic insulating layer and overlapping the scan control lines, a third organic insulating layer disposed on the etch stop pattern, and a first sub-power voltage line disposed on the third organic insulating layer and overlapping the scan control lines.

The first conductive layer may further comprise a second sub-power voltage line. The first sub-power voltage line and the second sub-power voltage line may be electrically connected with each other through the etch stop pattern.

The display device may further comprise a display area for displaying a image, and a non-display area disposed in the periphery of the display area. The scan stages and the scan control lines may be disposed in the non-display area.

The display device may further comprise a driving chip disposed in the non-display area. The driving chip may be electrically connected with the scan stages through the scan control lines.

The display device may further comprise a dam structure disposed outside the scan stages and the scan control lines, including the first organic insulating layer and the second organic insulating layer.

The display device may further comprise light emitting stages disposed on the substrate, and light emitting control lines electrically connected to each of the light emitting stages.

The display device may further comprise a valley portion disposed between the scan stages and scan control lines and the light emitting stages and light emitting control lines and defined by the first organic insulating layer and the second organic insulating layer.

The valley portion may pass through the first organic insulating layer and the second organic insulating layer in a thickness direction.

According to an embodiment of the disclosure, a display device comprises a display area, a scan driver disposed outside the display area, comprising scan stages and scan control lines electrically connected to each of the scan stages, a first organic insulating layer disposed on the scan control lines, a second organic insulating layer disposed on the first organic insulating layer, and a power voltage line disposed on the second organic insulating layer.

The first organic insulating layer and the second organic insulating layer, which are disposed between the power voltage line and the scan stages, may have a first thickness that is within the range of 0.9 μm to 1.7 μm.

The display device may further comprise a third organic insulating layer disposed on the second organic insulating layer, and an anode electrode disposed on the third organic insulating layer. The power voltage line may include the same material as that of the anode electrode.

The display device may further comprise a pixel defining layer disposed on the anode electrode while exposing the anode electrode, a light emitting layer disposed on the anode electrode exposed by the pixel defining layer, and a cathode electrode disposed on the light emitting layer.

In the display device according to one embodiment, a short between a power voltage line and a scan driving line may be suppressed or avoided in an area where the power voltage line and the scan driving line overlap each other.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
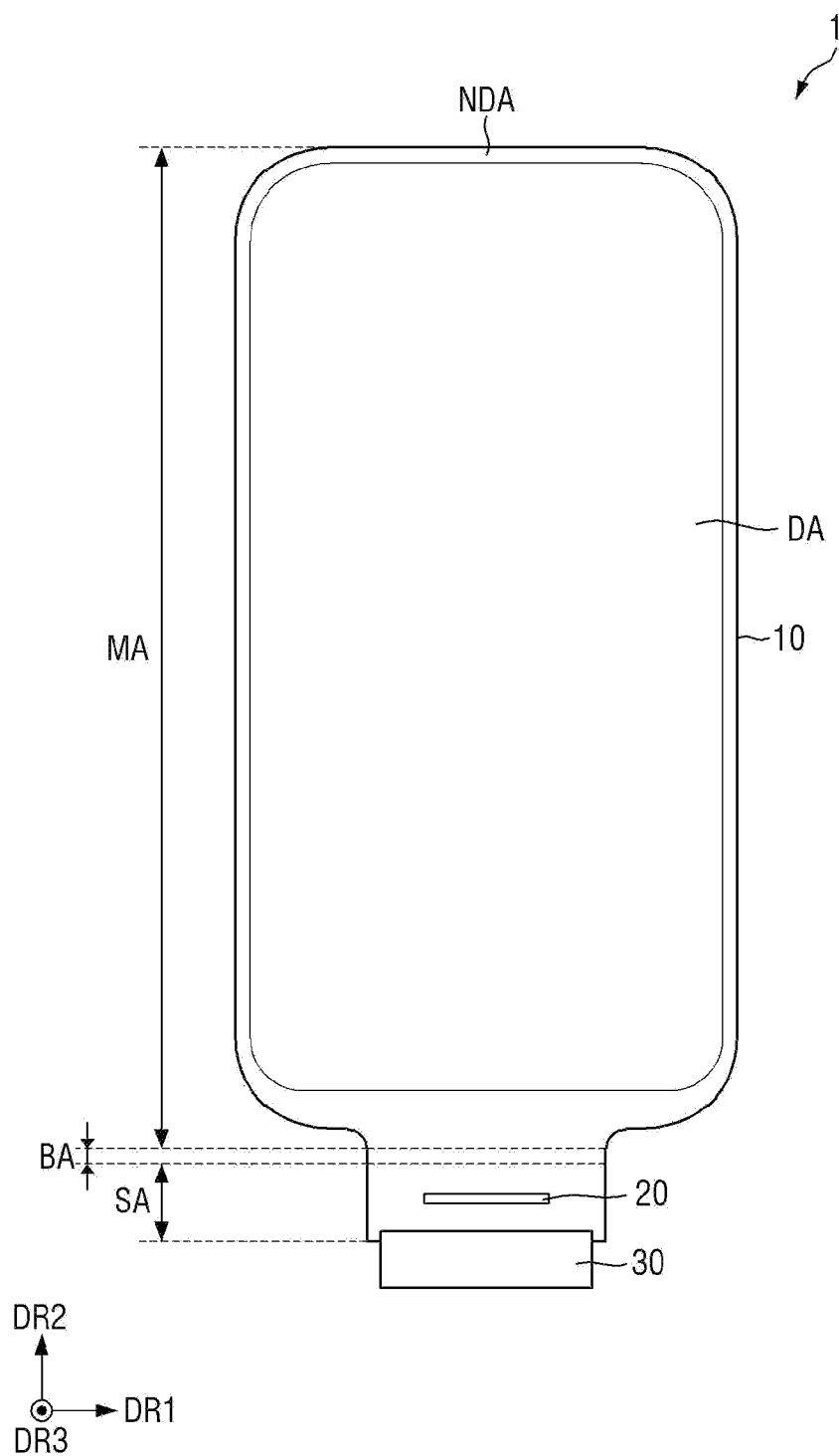
FIG. 1 is a plane view illustrating a display device according to one embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

Figure 2:
FIG. 2 is a side view illustrating a display device of FIG. 1.
Figure 2:
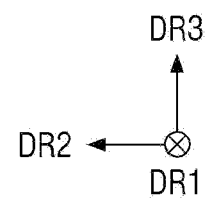

FIG. 1 is a plane view illustrating a display device according to one embodiment. FIG. 2 is a side view illustrating a display device of FIG. 1. FIG. 2 illustrates a side shape of a display device that is bent in a thickness direction.

In the drawings, a first direction DR1 refers to a horizontal direction of a display device 1 on a plane view, and a second direction DR2 refers to a vertical direction of the display device 1 on the plane view. Also, a third direction DR3 refers to a thickness direction of the display device 1. The first direction DR1 and the second direction DR2 cross each other in a vertical direction, and the third direction DR3 is a direction crossing the plane on which the first direction DR1 and the second direction DR2 are arranged and crosses both the first direction DR1 and the second direction DR2 in a vertical direction. However, it is to be understood that the direction mentioned in the embodiment refers to a relative direction and the embodiment is not limited to the direction mentioned herein.

Unless otherwise defined, in this specification, one side of the first direction DR1 refers to a right direction on the plane view, and the other side of the first direction DR1 refers to a left direction on the plane view. One side of the second direction DR2 refers to an upper direction on the plane view, and the other side of the second direction DR2 refers to a lower direction on the plane view. Also, "upper portion" or "upper surface" expressed based on the third direction DR3 refers to a side of a display surface based on a display panel 10, and "lower portion" or "lower surface" expressed based on the third direction DR3 refers to an opposite side of the display surface based on the display panel 10.

Referring to FIGS. 1 and 2, the display device 1 is a device for displaying a moving image or a still image. The display device 1 may be used as a display screen of various products such as a television, a laptop computer, a monitor, a billboard, and a device for Internet of things (IoT) as well as portable electronic devices such as a mobile phone, a smartphone, a tablet personal computer (PC), a smart watch, a watch phone, a mobile communication terminal, an electronic notebook, an electronic book, a portable multimedia player (PMP), a navigator and an ultra mobile PC (UMPC).

The display device 1 according to one embodiment may have a substantially rectangular shape on a plane. The display device 1 may have a rectangular shape with perpendicular corners on a plane, but is not limited thereto. The display device 1 may have a rectangular shape with rounded corners on a plane.

In the case that the display device 1 includes a rectangular shape on a plane, two sides disposed on one side and the other side of the first direction DR1, which are extended to the second direction DR2, may be longer than two sides disposed on one side and the other side of the second direction DR2, which are extended to the first direction DR1. In other words, the two sides of the display device 1, which are disposed on one side and the other side of the first direction DR1, may be long sides, and the two sides of the display device 1, which are disposed on one side and the other side of the second direction DR2, may be short sides.

The display device 1 may include a display panel 10. The display panel 10 may be a flexible substrate that includes a flexible polymer material such as polyimide. Therefore, the display panel 10 may be curved, bent, folded, folded or rolled.

The display panel 10 may be an organic light emitting display panel. In the following embodiment, the organic light emitting display panel is applied as the display panel 10, but other types of display panels such as a liquid crystal display panel, a quantum dot organic light emitting display panel, a quantum dot liquid crystal display, a quantum nano light emitting display panel and a micro LED may be applied without being limited to the organic light emitting display panel.

The display panel 10 may include a display area DA for displaying a screen and a non-display area NDA for not displaying a screen. The display panel 10 may be divided into the display area DA and the non-display area NDA on the plane view. The non-display area NDA may be disposed to surround the display area DA. The non-display area NDA may constitute a bezel.

The display area DA may correspond to a plane shape of the display device 1. The display area DA may have a rectangular shape with perpendicular corners or a rectangular shape with rounded corners on the plane. However, the plane shape of the display area DA may have a circular shape, an oval shape or other various shapes without being limited to the rectangular shape.

The display area DA may include a plurality of pixels. Each pixel may be arranged in a matrix shape. Each pixel may include a light emitting layer and a circuit layer for controlling the light emitting amount of the light emitting layer. The circuit layer may include a line, an electrode and at least one transistor. The light emitting layer may include an organic light emitting material. The light emitting layer may be encapsulated by an encapsulation film. A detailed configuration of the pixel will be described later.

The non-display area NDA may surround all sides of the display area DA, and may constitute an edge of the display area DA, but the present disclosure is not limited thereto.

The display panel 10 may include a main area MA and a bending area BA connected to one side of the main area MA in the second direction DR2. The display panel 10 may further include a sub-area SA connected with the bending area BA at one side of the second direction DR2 and bent in a thickness direction to overlap the main area MA in the thickness direction.

The display area DA may be positioned in the main area MA. The non-display area NDA may be positioned at a peripheral edge portion of the display area DA of the main area MA.

The main area MA may have a shape similar to an external shape on the plane of the display device 1. The main area MA may be a flat area positioned on one plane, but is not limited thereto. However, at least one of the other edges except the edge (side) connected with the bending area BA in the main area MA may be curved to form a curved surface or bent in a vertical direction.

In the case that at least one of the other edges except the edge (side) connected with the bending area BA in the main area MA is curved or bent, the display area DA may be disposed even at the corresponding edge, but is not limited thereto. The non-display area NDA for not displaying a screen may be disposed at the curved or bent edge, or the display area DA and the non-display area NDA may be disposed together at the curved or bent edge.

The non-display area NDA of the main area MA may be positioned in an area from an outer boundary of the display area DA to the edge of the display panel 10. Signal lines or driving circuits for applying signals to the display area DA may be disposed in the non-display area NDA of the main area MA.

The bending area BA may be connected with one short side of the main area MA. A width of the bending area BA (width of the first direction DR1) may be narrower than that (width of a short side) of the main area MA. A connection portion of the main area MA and the bending area BA may have an L-shaped cutting shape to reduce a width of the bezel.

In the bending area BA, the display panel 10 may be bent with a curvature in an opposite direction of a display surface. As the display panel 10 is bent in the bending area BA, the surface of the display panel 10 may be inverted. That is, one surface of the display panel 10, which is oriented toward an upper portion, may be changed toward a lower portion after oriented toward a lateral outside through the bending area BA.

The sub-area SA is extended from the bending area BA. The sub-area SA may be extended from a point where bending is completed, to a direction parallel with the main area MA. The sub-area SA may overlap the main area MA in the thickness direction of the display panel 10. The sub-area SA may overlap the non-display area NDA at the edge of the main area MA, and may further overlap the display area DA of the main area MA. A width of the sub-area SA may be the same as that of the bending area BA, but is not limited thereto.

A pad portion may be disposed on the sub-area SA of the display panel 10. An external device may be packaged on (or attached to) the pad portion. Examples of the external device include a driving chip 20 and a driving substrate 30 made of a flexible printed circuit board and a rigid printed circuit board. In addition, a line connection film, a connector or the like may be packaged on the pad portion as the external device. Although a single external device may be packaged on the sub-area SA, a plurality of external devices may be provided. For example, as illustrated in FIGS. 1 and 2, the driving chip 20 may be disposed in the sub-area SA of the display panel 10, and the driving substrate 30 may be attached to an end of the sub-area SA. In this case, the display panel 10 may include a pad portion connected with the driving chip and a pad portion connected with the driving substrate 30. In another embodiment, the driving chip may be packaged on a film, and the film may be attached to the sub-area SA of the display panel 10.

The driving chip 20 is packaged on one surface of the display panel 10, which is the same surface as the display surface, and is packaged on the surface of the display panel 10, which is oriented toward a lower portion in the thickness direction as the bending area BA is bent and inverted as described above, whereby the upper surface of the driving chip 20 may be oriented toward the lower portion.

The driving chip 20 may be attached onto the display panel 10 through an anisotropic conductive film, or may be attached onto the display panel 10 through ultrasonic bonding. The driving chip 20 may include an integrated circuit for driving the display panel 10.

Figure 3:
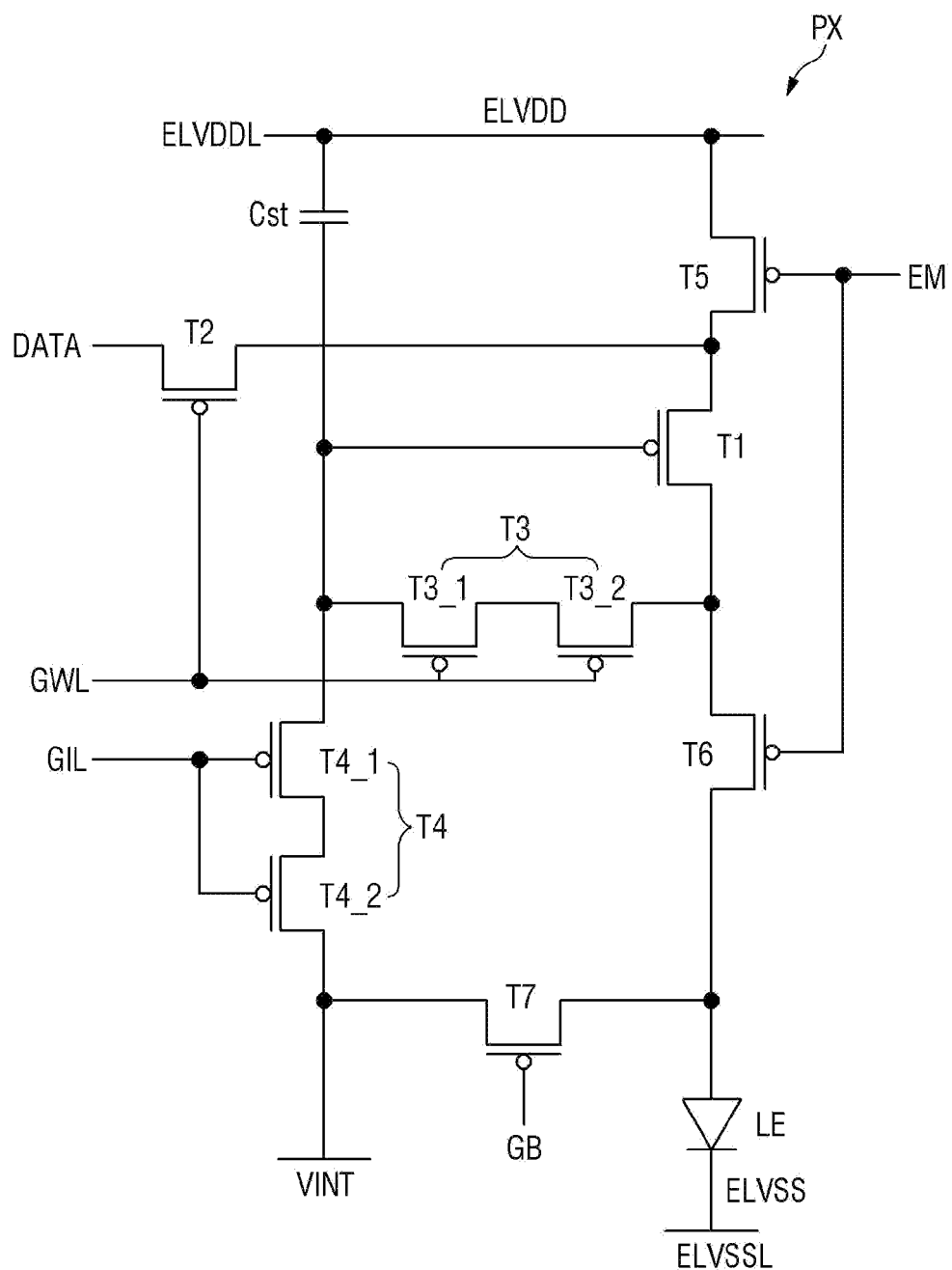
FIG. 3 is a detailed circuit view illustrating one pixel according to one embodiment.

FIG. 3 is a circuit view illustrating one pixel according to one embodiment.

Referring to FIG. 3, a circuit of a pixel PX includes a plurality of transistors T1 to T7, a capacitor Cst and a light emitting element LE. A data signal DATA, a first scan signal GW, a second scan signal GI, a third scan signal GB, a light emitting control signal EM, a first power voltage ELVDD, a second power voltage ELVSS and an initialization voltage VINT are applied to the circuit of one pixel PX.

The light emitting element LE may be, but not limited to, an organic light emitting diode OLED that includes a first electrode (or anode electrode), a light emitting layer and a second electrode (or cathode electrode).

The plurality of transistors may include first to seventh transistors T1 to T7. Each of the transistors T1 to T7 includes a gate electrode, a first electrode (or first source/drain electrode) and a second electrode (or second source/drain electrode). One of the first electrode and the second electrode of each of the transistors T1 to T7 is a source electrode and the other one is a drain electrode.

The first transistor T1 may serve as a driving transistor, and the second to seventh transistors T2 to T7 may serve as switching transistors. Each of the transistors T1 to T7 includes a gate electrode, a first electrode and a second electrode. One of the first electrode and the second electrode of each of the transistors T1 to T7 is a source electrode and the other one is a drain electrode.

Each of the transistors T1 to T7 may be a thin film transistor. Each of the transistors T1 to T7 may be any one of a PMOS transistor and an NMOS transistor. In one embodiment, the first transistor T1 that is a driving transistor, the second transistor T2 that is a data transfer transistor, the third transistor T3 that is a compensation transistor, the fourth transistor T4 that is a first initialization transistor, the fifth transistor T5 that is a first light emitting control transistor, the sixth transistor T6 that is a second light emitting control transistor and the seventh transistor T7 that is a second initialization transistor are all PMOS transistors.

However, the transistors are not limited to the above example. For example, the third transistor T3 that is a compensation transistor and the fourth transistor T4 that is a first initialization transistor may be NMOS transistors, the first transistor T1 that is a driving transistor, the second transistor T2 that is a data transfer transistor, the fifth transistor T5 that is a first light emitting control transistor, the sixth transistor T6 that is a second light emitting control transistor, and the seventh transistor T7 that is a second initialization transistor may be PMOS transistors. In this case, active layers of the third transistor T3 and the fourth transistor T4 may include a material different from that of active layers of the first transistor T1, the second transistor T2, the fifth transistor T5, the sixth transistor T6 and the seventh transistor T7. For example, each active layer of the third transistor T3 and the fourth transistor T4 may include, but is not limited to, an oxide semiconductor, and each active layer of the first transistor T1, the second transistor T2, the fifth transistor T5, the sixth transistor T6 and the seventh transistor T7 may include, but is not limited to, polycrystalline silicon.

Hereinafter, each of the elements will be described in detail.

A gate electrode of the first transistor T1 is connected with a first electrode of the capacitor Cst. The first electrode of the first transistor T1 is connected to the first power voltage line ELVDDL ELVDD via the fifth transistor T5. The second electrode of the first transistor T1 is connected with the anode electrode of the light emitting element LE via the sixth transistor T6. The first transistor T1 receives the data signal DATA in accordance with a switching operation of the second transistor T2 and supplies a driving current to the light emitting element LE.

The gate electrode of the second transistor T2 is connected to a first scan signal line that applies the first scan signal GW1. A first electrode of the second transistor T2 is connected with the data line for applying the data signal DATA. The second electrode of the second transistor T2 is connected with the first electrode of the first transistor T1. The second transistor T2 is turned on in accordance with the first scan signal GW to perform the switching operation for transferring the data signal DATA to the first electrode of the first transistor T1.

The third transistor T3 may be formed of a dual transistor that includes a first sub-transistor T3_1 and a second sub-transistor T3_2. A gate electrode of the first sub-transistor T3_1 is connected to a first scan signal line for applying the first scan signal GW, its first electrode is connected to a second electrode of the second sub-transistor T3_2 and its second electrode is connected to the first electrode of the capacitor Cst, a first electrode of the third sub-transistor T4_1 and the gate electrode of the first transistor T1. A gate electrode of the second sub-transistor T32 may be connected to the first scan signal line for applying the first scan signal GW, its first electrode may be connected to the second electrode of the first transistor T1 and its second electrode may be connected to the first electrode of the first sub-transistor T3_1.

The first sub-transistor T3_1 and the second sub-transistor T3_2 are turned on by the first scan signal GW to connect the gate electrode with the second electrode of the first transistor T1 to diode-connect the first transistor T1. Therefore, a voltage difference is generated between the first electrode and the gate electrode of the first transistor T1 as much as a threshold voltage of the first transistor T1, and the data signal DATA of which threshold voltage is compensated may be supplied to the gate electrode of the first transistor T1 to compensate for the threshold voltage deviation of the first transistor T1.

The fourth transistor T4 may be formed of a dual transistor that includes a third sub-transistor T4_1 and a fourth sub-transistor T4_2. A gate electrode of the third sub-transistor T4_1 may be connected to a second scan signal line for applying the second scan signal GI, the first electrode may be connected to the first electrode of the capacitor Cst, the second electrode of the first sub-transistor T3_1 and the gate electrode of the first transistor T1, and its second electrode may be connected to a first electrode of the fourth sub-transistor T4_2. A gate electrode of the fourth sub-transistor T4_2 may be connected to the second scan signal line for applying the second scan signal GI, its first electrode may be connected to the second electrode of the third sub-transistor T4_1 and its second electrode may be connected to the initialization voltage VINT. The third sub-transistor T4_1 and the fourth sub-transistor T4_2 are turned on by the second scan signal GI to transfer the initialization voltage VINT to the gate electrode of the first transistor T1, thereby initializing the voltage of the gate electrode of the first transistor T1.

A gate electrode of the fifth transistor T5 is connected to a light emitting control signal line for applying the light emitting control signal EM, its first electrode is connected to the first power voltage line ELVDDL and its second electrode is connected to the first electrode of the first transistor T1. The fifth transistor T5 is turned on by the light emitting control signal EM to connect the first electrode of the first transistor T1 with the first power voltage line ELVDDL.

The sixth transistor T6 is connected between the second electrode of the first transistor T1 and the first electrode of the light emitting element LE. A gate electrode of the sixth transistor T6 is connected to a light emitting control signal line for applying the light emitting control signal EM, the first electrode is connected to the second electrode of the first transistor T1 and the first electrode of the second sub-transistor T3_2 and its second electrode is connected to the first electrode of the light emitting element LE.

The fifth transistor T5 and the sixth transistor T6 are simultaneously turned on in accordance with the light emitting control signal EM, whereby a driving current flows to the light emitting element LE.

A gate electrode of the seventh transistor T7 is connected to a third scan signal line for applying the third scan signal GB. The first electrode of the seventh transistor T7 is connected with the anode electrode of the light emitting element LE. The second electrode of the seventh transistor T7 is connected with an initialization voltage line for applying the initialization voltage Vint. The seventh transistor T7 is turned on in accordance with the third scan signal GB to initialize the anode electrode of the organic light emitting diode OLED.

Although the third scan signal GB is applied to the gate electrode of the seventh transistor T7 in the present embodiment, as another embodiment, the light emitting control signal EM may be applied to the gate electrode of the seventh transistor T7, or the circuit of the pixel PX may be configured such that the second scan signal GI is applied to gate electrode of the seventh transistor T7.

The capacitor Cst is formed between the gate electrode of the first transistor T1 and the first power voltage line ELVDDL, and includes a first electrode and a second electrode. The first electrode of the capacitor Cst may be connected to the gate electrode of the first transistor T1, the second electrode of the third transistor T3 and the first electrode of the fourth transistor T4, and the second electrode of the capacitor Cst may be connected to the first power voltage line ELVDDL. The capacitor Cst may serve to uniformly maintain a data voltage applied to the gate electrode of the first transistor T1.

The cathode electrode of the light emitting element LE is connected with a second power voltage line ELVSSL, and receives a second power voltage ELVSS from the second power voltage line ELVSSL. The light emitting element LE emits light using the driving current transferred from the first transistor T1, thereby displaying an image.

Figure 4:
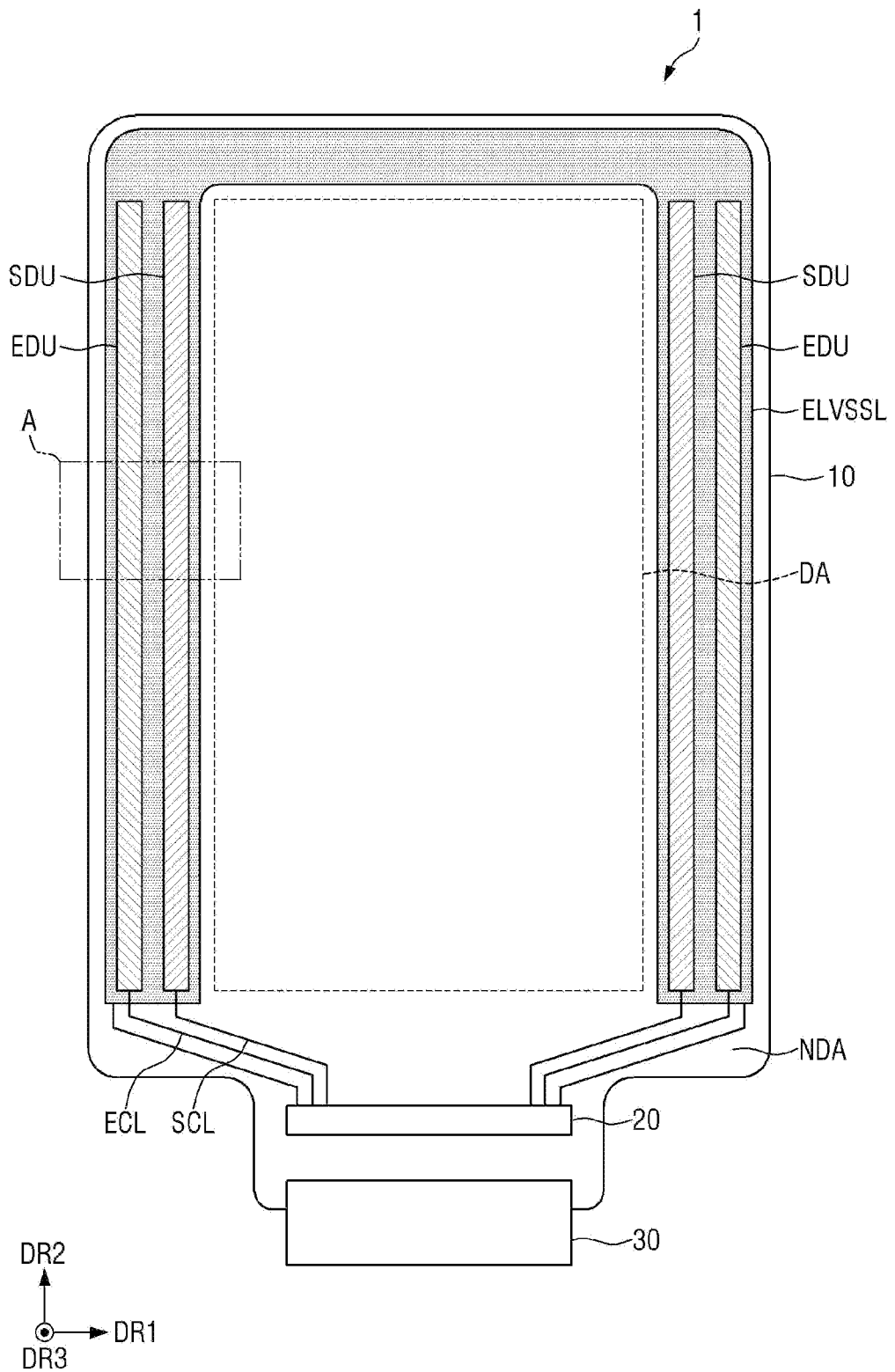
FIG. 4 is a plane view illustrating a layout of a scan driver and a light emitting driver of a display device according to one embodiment.
Figure 5:
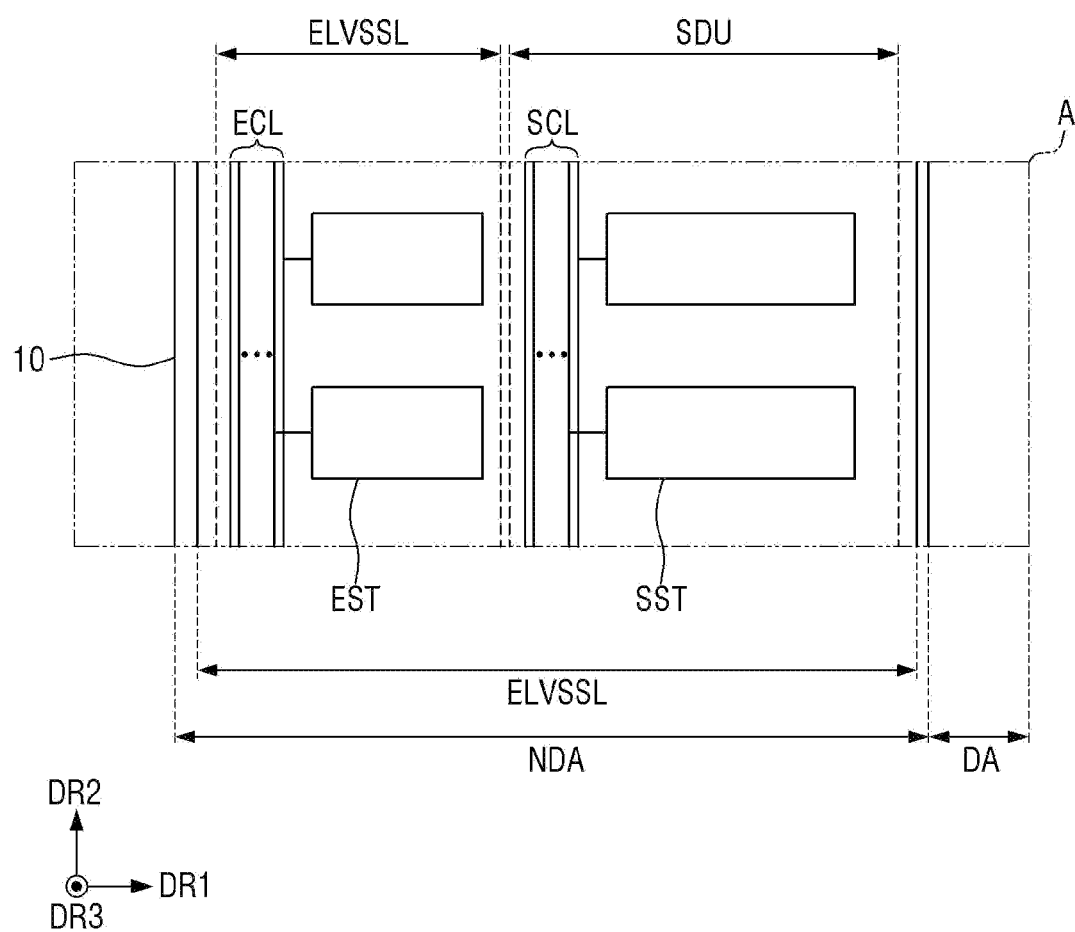
FIG. 5 is an enlarged view illustrating an area A of FIG. 4.

FIG. 4 is a plane view illustrating a layout of a scan driver and a light emitting driver of a display device according to one embodiment. FIG. 5 is an enlarged view illustrating an area A of FIG. 4.

Referring to FIGS. 4 and 5, the display device 1 may further include a scan driver SDU and a light emitting driver EDU.

The scan driver SDU and the light emitting driver EDU may be disposed in the non-display area NDA. The light emitting driver EDU may be disposed outside the scan driver SDU. In other words, the scan driver SDU may be disposed to be closer to the display area DA than the light emitting driver EDU, but is not limited thereto. The scan driver SDU and the light emitting driver EDU may be disposed on one side and the other side of the first direction DR1 of the display area DA, but are not limited thereto. The scan driver SDU and the light emitting driver EDU may be disposed only on one side and the other side of the first direction DR1 of the display area DA.

Figure 6:
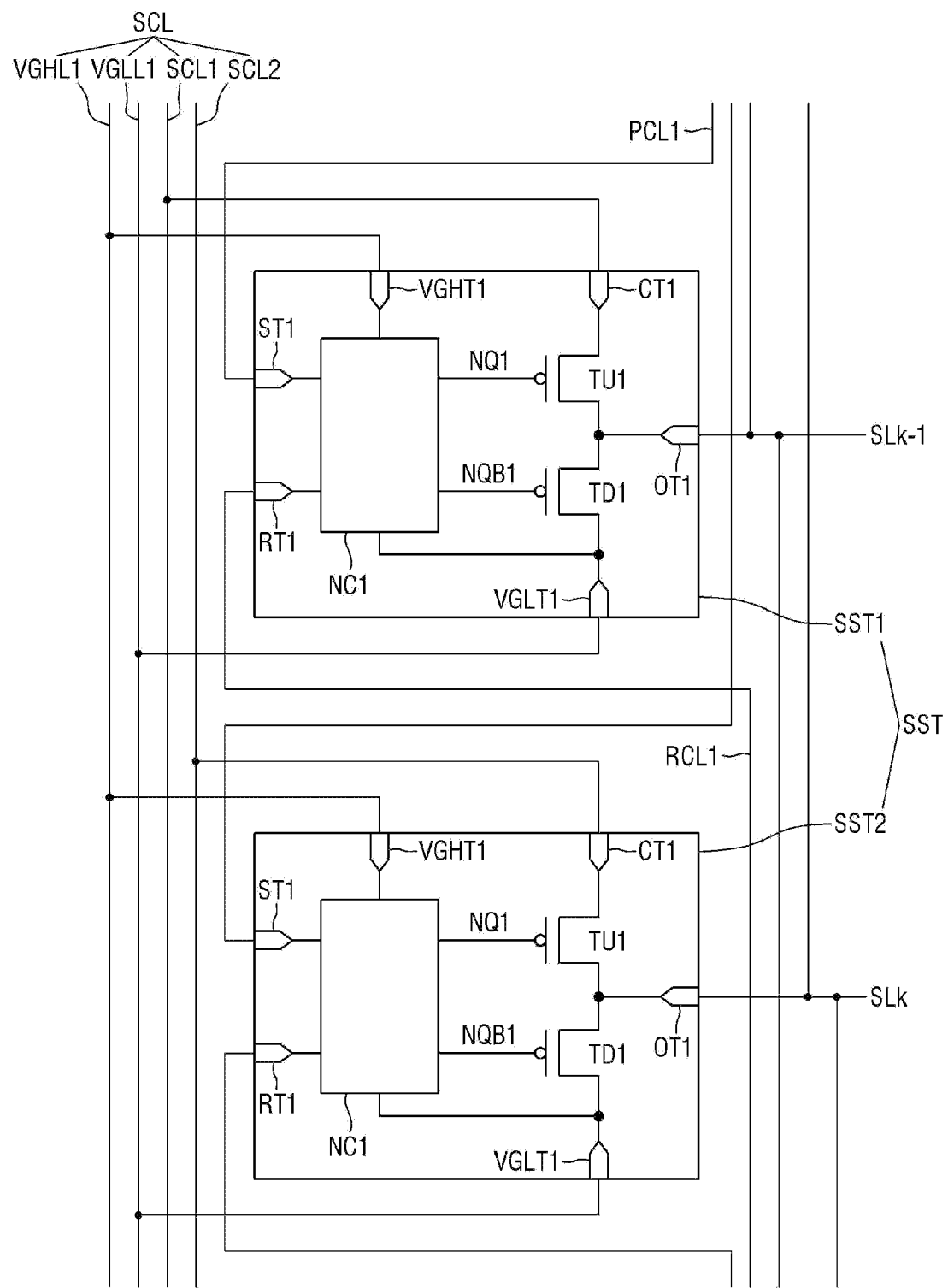
FIG. 6 is a circuit view illustrating an example of a scan driver of FIG. 5.

The scan driver SDU may include a plurality of scan stages SST and a plurality of scan control lines SCL. Each of the plurality of scan stages SST may be connected to at least one of a plurality of scan control lines SCL. Each of the plurality of scan stages SST may generate scan signals in accordance with a scan control signal of the scan control lines SCL to output the scan signals to scan lines SLk-1 and SLk (FIG. 6).

The scan control lines SCL may be extended in the second direction DR2, and may be disposed between the scan driver SDU and the light emitting driver EDU based on the first direction DR1. The scan control lines SCL may electrically be connected to the driving chip 20. The scan control lines SCL may be supplied with the scan control signals from the driving chip 20. The scan control signals may include scan clock signals and scan start signals.

Figure 7:
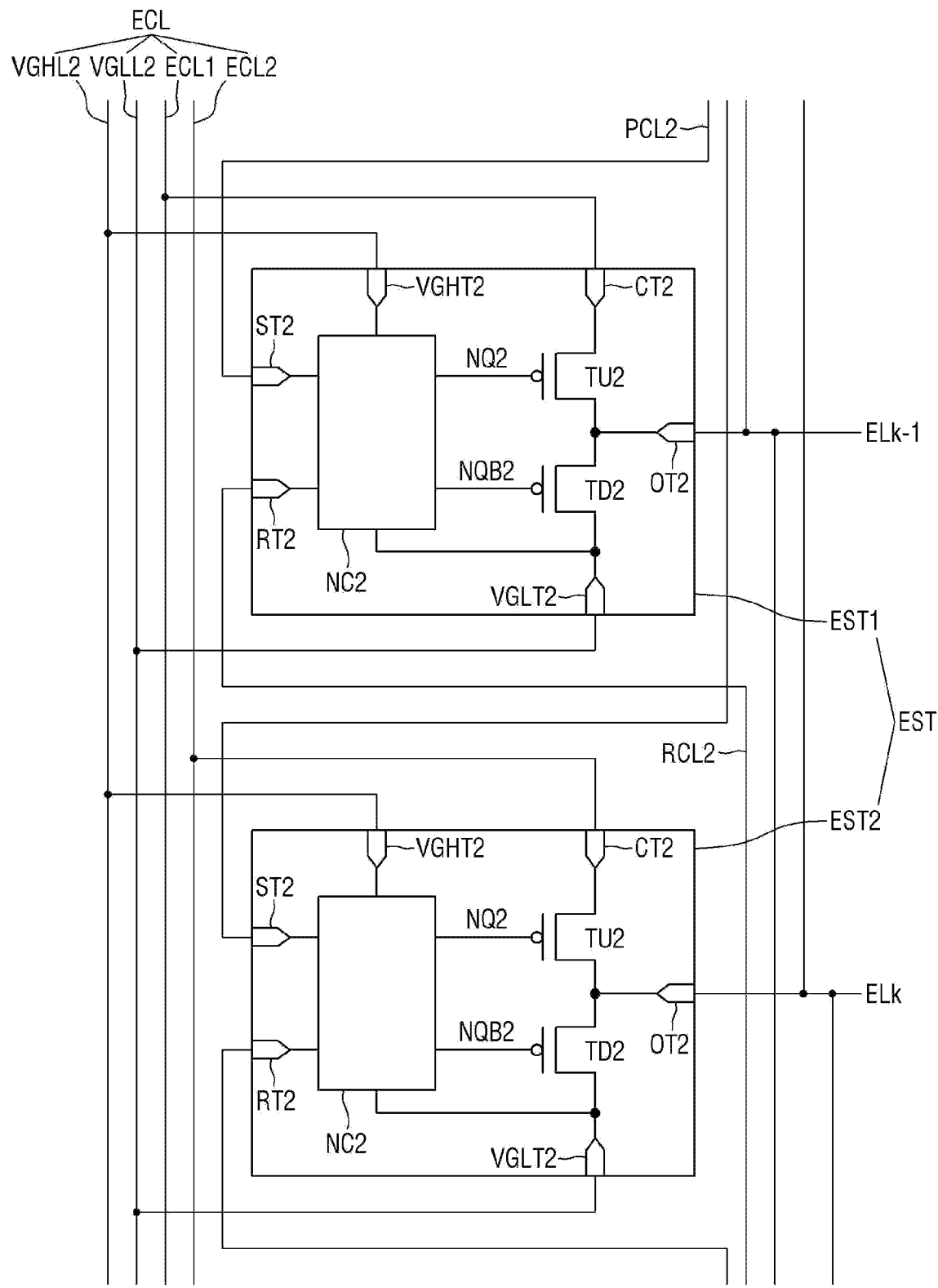
FIG. 7 is a circuit view illustrating an example of a light emitting driver of FIG. 5.

The light emitting driver EDU may include a plurality of light emitting stages EST and a plurality of light emitting control lines ECL. Each of the plurality of light emitting stages EST may be connected to at least one of the plurality of light emitting control lines ECL. Each of the plurality of light emitting stages EST may generate light emitting signals in accordance with a light emitting control signal of the light emitting control line ECL and output the light emitting signals to the light emitting lines ELk-1 and ELk (FIG. 7).

The light emitting control lines ECL may be disposed outside the light emitting driver EDU. The light emitting control lines ECL may electrically be connected to the driving chip 20. The light emitting control lines ECL may be supplied with light emitting control signals from the driving chip 20. The light emitting control signals may include light emitting clock signals and a light emitting start signal.

The second power voltage line ELVSSL may be disposed in the non-display area NDA. The second power voltage line ELVSSL may be disposed on one side and the other side of the first direction DR1 of the display area DA and on one side of the second direction DR2. In other words, the second power voltage line ELVSSL may be disposed to bypass the display area DA. The second power voltage line ELVSSL may be extended from one side and the other side of the first direction DR1 of the display area DA to the second direction DR2, and may be extended from one side of the second direction DR2 to the first direction DR1.

The second power voltage line ELVSSL may overlap the scan driver SDU and the light emitting driver EDU at one side and the other side of the first direction DR1 of the display area DA in the thickness direction (third direction DR3). The second power voltage line ELVSSL may electrically be connected to the driving chip 20. The second power voltage line ELVSSL may be supplied with the second power voltage ELVSS (see FIG. 3) from the driving chip 20.

The second power voltage line ELVSSL may overlap the scan control lines SCL, and a second organic insulating layer 125 (see FIG. 8) may be disposed between the second power voltage line ELVSSL and the scan control lines SCL in the overlap area where the second power voltage line ELVSSL overlaps the scan control lines SCL. The second organic insulating layer 125 (see FIG. 8) may overlap all of the plurality of scan control lines SCL. Therefore, a short between the second power voltage line ELVSSL and the scan control line SCL may be suppressed or avoided. Regarding this, a detailed description will be described later.

FIG. 6 is a circuit view illustrating an example of the scan driver of FIG. 5.

Referring to FIG. 6, the scan driver SDU may include a plurality of scan stages SST. Although FIG. 6 shows two scan stages (first sub-scan stage SST1 and second sub-scan stage SST2), the number of scan stages SST may be more than two.

The first sub-scan stage SST1 and the second sub-scan stage SST2 may sequentially output scan signals. For example, the first sub-scan stage SST1 may be connected to a (k-1)th scan line SLk-1 to output a (k-1)th scan signal. The second sub-scan stage SST2 may be connected to a kth scan line SLk to output a kth scan signal.

The kth scan signal output from the kth scan line SLk may substantially be the same as the first scan signal GW (see FIG. 3) and the third scan signal GB (see FIG. 3) and the (k-1)th scan signal output from the k-1-th scan line SLk-1 may substantially be the same as the second scan signal GI (see FIG. 3), but are not limited thereto. In other words, the kth scan line SLk may be connected to the gate electrode of the second transistor T2 (see FIG. 3) of one pixel PX (see FIG. 3) and the gate electrode of the third transistor T3 (see FIG. 3), and the (k-1)th scan line SLk-1 may be connected to the gate electrode of the fourth transistor T4 (see FIG. 3) of one pixel PX (see FIG. 3).

The first sub-scan stage SST1 and the second sub-scan stage SST2 may be connected to the scan control lines SCL. The scan control lines SCL may include a scan start signal line to which a scan start signal is applied, scan clock lines SCL1 and SCL2 to which scan clock signals are applied, a first gate-on voltage line VGHL1, and a first gate-off voltage line VGLL1. In FIG. 6, the scan start signal line is omitted for convenience of description.

As shown in FIG. 6, each of the first sub-scan stage SST1 and the second sub-scan stage SST2 includes a first pull-up transistor TU1 turned on when each of a first pull-up node NQ1, a first pull-down node NQB1 and a first pull-up node NQ1 has a first gate-on voltage, a first pull-down transistor TD1 turned on when the first pull-down node NQB1 has a first gate-on voltage, and a first node controller NC1 for controlling charging and discharging of the first pull-up node NQ1 and the first pull-down node NQB1.

The first node controller NC1 includes a first start terminal ST1, a first reset terminal RT1, a first gate-on voltage terminal VGHT1, a first gate-off voltage terminal VGLT1, a first clock terminal CT1 and a first output terminal OT1. The first start terminal ST1 may be connected to a scan start line to which a scan start signal is applied or a first previous carry line PCL1 to which an output signal of a previous stage is applied. The first reset terminal RT1 may be connected to a first rear carry line RCL1 to which an output signal of a rear stage is input. The first gate-on voltage terminal VGHT1 may be connected to a first gate-on voltage line VGHL1 to which the first gate-on voltage is applied. The first gate-off voltage terminal VGLT1 may be connected to a first gate-off voltage line VGLL1 to which a gate-off voltage is applied. The first gate-on voltage may be a first level voltage, and the first gate-off voltage may be a second level voltage. The first node controller NC1 may include a plurality of thin film transistors.

The first clock terminal CT1 may be connected to any one of the first scan clock line SCL1 to which a first scan clock signal is applied and the second scan clock line SCL2 to which a second scan clock signal is applied. The stages SST1 and SST2 may alternately be connected to the first scan clock line SCL1 and the second scan clock line SCL2. For example, when the first clock terminal CT1 of the first sub-scan stage SST1 is connected to the first scan clock line SCL1, the first clock terminal CT1 of the second sub-scan stage SST2 may be connected to the second scan clock line SCL2. In FIG. 6, the first sub-scan stage SST1 and the second sub-scan stage SST2 are alternately connected to the two scan clock lines SCL1 and SCL2, but are not limited thereto. For example, the first sub-scan stage SST1 and the second sub-scan stage SST2 may alternately be connected to three or more scan clock lines.

The first output terminal OT1 may be connected to any one of the scan lines SLk-1 to SLk. The stages SST1 and SST2 may sequentially be connected to the scan lines SLk-1 and SLk. For example, the first output terminal OT1 of the first sub-scan stage SST1 may be connected to the (k-1)th scan line SLk-1, and the first output terminal OT1 of the second sub-scan stage SST2 may be connected to the kth scan line SLk.

Also, FIG. 6 illustrates that the first pull-up transistor TU1 and the first pull-down transistor TD1 of the first sub-scan stage SST1 and the second sub-scan stage SST2 and the plurality of transistors of the first node controller NC1 are formed of P-type MOSFETs, but the embodiments as described herein are not limited thereto. That is, the first pull-up transistor TU1 and the first pull-down transistor TD1 of the first sub-scan stage SST1 and the second sub-scan stage SST2 and the plurality of transistors of the first node controller NC1 may be formed of N-type MOSFETs.

FIG. 7 is a circuit view illustrating an example of a light emitting driver of FIG. 5.

Referring to FIG. 7, the light emitting driver EDU may include a plurality of light emitting stages EST. Although FIG. 7 shows two scan stages (first sub-light emitting stage EST1 and second sub-light emitting stage EST2), the number of light emitting stages EST may be more than two.

The first sub-light emitting stage EST1 and the second sub-light emitting stage EST2 may sequentially output light emitting signals. For example, the first sub-light emitting stage EST1 may be connected to the (k-1)th light emitting line ELk-1 to output the (k-1)th light emitting signal. The second sub-light emitting stage EST2 may be connected to the kth light emitting line ELk to output a kth light emitting signal.

The first sub-light emitting stage EST1 and the second sub-light emitting stage EST2 may be connected to the light emitting control lines ECL. The light emitting control lines ECL include a light emitting start signal line to which a light emitting start signal is applied, light emitting clock lines ECL1 and ECL2 to which light emitting clock signals are applied, a second gate-on voltage line VGHL2, and a second gate-off voltage line VGLL2. In FIG. 7, the light emitting start signal line is omitted for convenience of description.

The kth light emitting signal output from the kth light emitting line ELk may substantially be the same as the light emitting control signal EM (see FIG. 3), but is not limited thereto. In other words, the kth scan line SLk may be connected to the gate electrode of the fifth transistor T5 (see FIG. 3) of one pixel PX (see FIG. 3) and the gate electrode of the sixth transistor T6 (see FIG. 3).

As shown in FIG. 7, each of the first sub-light emitting stage EST1 and the second sub-light emitting stage includes a second pull-up transistor TU2 turned on when each of the second pull-up node NQ2, the second pull-down node NQB2 and the second pull-up node NQ2 has a second gate-on voltage, a second pull-down transistor TD2 turned on when the second pull-down node NQB2 has a second gate-on voltage, and a second node controller NC2 for controlling charging and discharging of the second pull-up node NQ2 and the second pull-down node NQB2.

The second node controller NC2 includes a second start terminal ST2, a second reset terminal RT2, a second gate-on voltage terminal VGHT2, a second gate-off voltage terminal VGLT2, a second clock terminal CT2, and a second output terminal OT2.

The first sub-light emitting stage EST1 and the second sub-light emitting stage EST2 receive a light emitting start signal different from the scan start signal and light emitting clock signals different from the scan clock signals. Therefore, the first sub-light emitting stage EST1 and the second sub-light emitting stage EST2 are different from the first sub-scan stage SST1 and the second sub-scan stage SST2, which are described with reference to FIG. 6, in outputting the light emitting signals different from the scan signals but their other description may substantially be the same as the description of the first sub-scan stage SST1 and the second sub-scan stage SST2. In this respect, in FIG. 7, the description of the first sub-light emitting stage EST1 and the second sub-light emitting stage EST2 will be omitted for convenience of description.

Hereinafter, a cross-sectional structure of the display panel will be described in detail.

First of all, the cross-sectional structure of the display area DA will be described with reference to FIG. 8.

Figure 8:
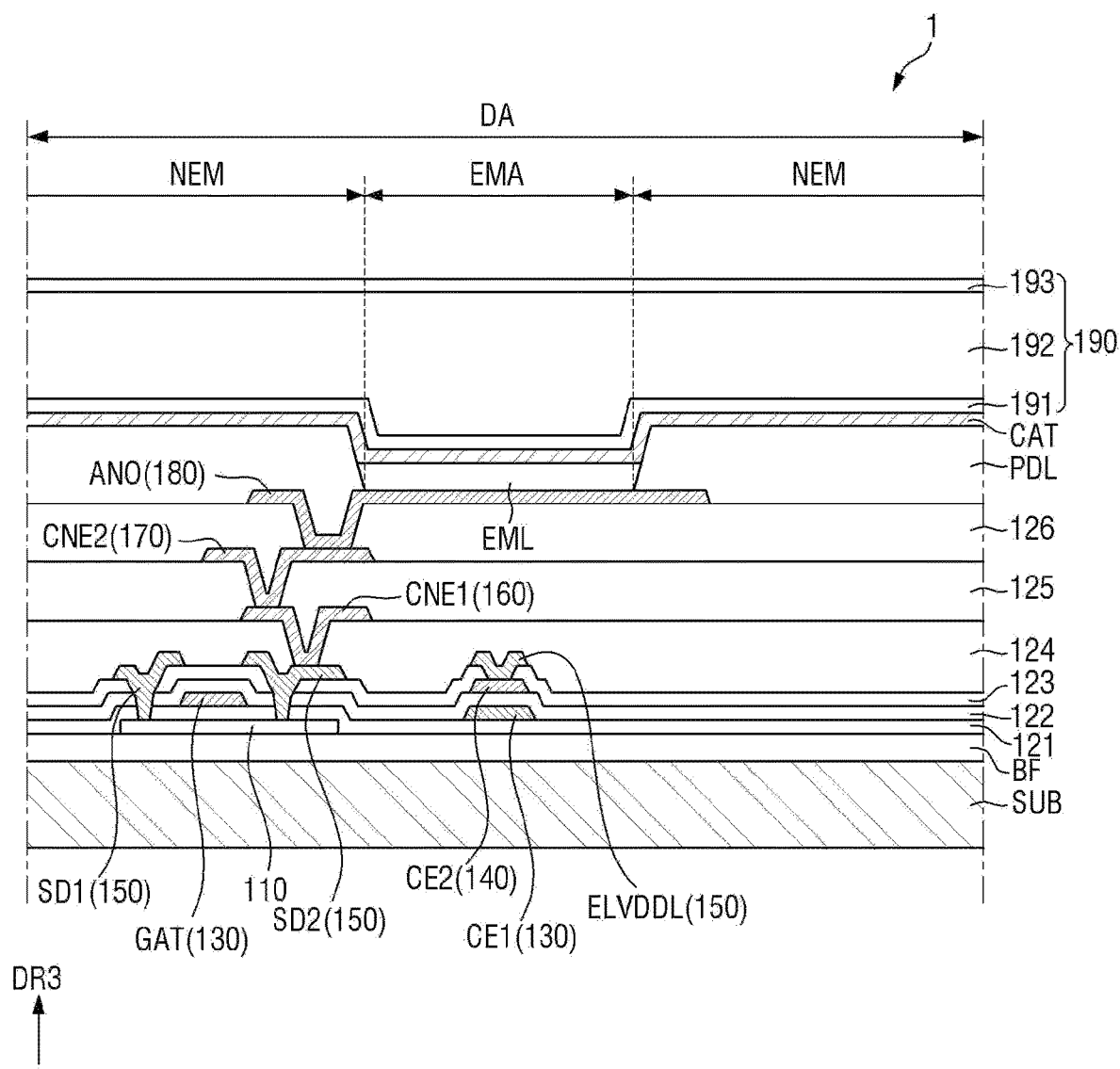
FIG. 8 is a cross-sectional view illustrating a display area of a display device according to one embodiment.

FIG. 8 is a cross-sectional view illustrating a display area of a display device according to one embodiment.

Referring to FIG. 8, the display panel 10 includes a substrate SUB, a buffer layer BF, a semiconductor layer 110, a first insulating layer 121 (first inorganic insulating layer), a first conductive layer 130, a second insulating layer 122 (second inorganic insulating layer), a second conductive layer 140, a third insulating layer 123 (third inorganic insulating layer), a third conductive layer 150, a fourth insulating layer 124 (first organic insulating layer), a fourth conductive layer 160, a fifth insulating layer 125 (second organic insulating layer), a fifth conductive layer 170, a sixth insulating layer 126 (third organic insulating layer), an anode electrode ANO, a pixel defining layer PDL, a light emitting layer EML, a cathode electrode CAT and an encapsulation layer 190. The respective layers may sequentially be deposited in the order described above. In addition, each of the layers may be formed of a single layer, but may be formed of a deposited layer including a plurality of layers. Another layer may further be disposed between the respective layers.

The substrate SUB supports the respective layers disposed thereon. A transparent substrate may be used when the organic light emitting display device is a bottom emission type or a double-sided emission type. When the organic light emitting display device is a top emission type, a translucent or opaque substrate as well as a transparent substrate may be used.

The substrate SUB may be a rigid substrate, or may be a flexible substrate capable of performing bending, folding, rolling or the like. An example of a material constituting the flexible substrate may include, but is not limited to, polyimide (PI).

The buffer layer BF may be disposed on the substrate SUB. The buffer layer BF may prevent or reduce impurity ions from being diffused, prevent or reduce permeation of moisture or the external air and perform a surface planarization function. The buffer layer BF may include, but is not limited to, silicon nitride, and may include silicon oxide or silicon oxynitride. The buffer layer BF may be omitted in some implementations of this embodiment depending on a type or process condition of the substrate SUB.

The semiconductor layer 110 is disposed on the buffer layer BF. The semiconductor layer 110 forms a channel of the transistors T1 to T7 (see FIG. 3) of the pixel. The semiconductor layer 110 may include polycrystalline silicon but is not limited thereto. The semiconductor layer 110 may include monocrystalline silicon, low temperature polycrystalline silicon, amorphous silicon or an oxide semiconductor. The oxide semiconductor may include, for example, a two-component compound (ABx), a three-component compound (ABxCy), or a four-component compound (ABxCyDz), which contains indium, zinc, gallium, tin, titanium, aluminum, hafnium (Hf), zirconium (Zr), magnesium (Mg), etc.

The first insulating layer 121 is disposed on the semiconductor layer 110. The first insulating layer 121 may be a first gate insulating layer having a gate insulation function. The first insulating layer 121 may include an inorganic insulating material. The first insulating layer 121 may include a silicon compound, a metal oxide and the like. For example, the first insulating layer 121 may include silicon oxide, silicon nitride, silicon oxynitride, aluminum oxide, tantalum oxide, hafnium oxide, zirconium oxide, titanium oxide and the like.

The first conductive layer 130 is disposed on the first insulating layer 121. The first conductive layer 130 may include a gate electrode GAT of a thin film transistor of a pixel, a scan line connected to the gate electrode GAT, and a first electrode CE1 of a capacitor Cst.

The first conductive layer 130 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer 122 may be disposed on the first conductive layer 30. The second insulating layer 122 may be an interlayer insulating layer or a second gate insulating layer. The second insulating layer 122 may include an inorganic insulating material. The second insulating layer 122 may include the same material as that of the first insulating layer 21, but is not limited thereto.

The second conductive layer 140 is disposed on the second insulating layer 122. The second conductive layer 140 may include a second electrode CE2 of the capacitor Cst. The second conductive layer 140 may be formed of the same material as that of the first conductive layer 130, but is not limited thereto.

The third insulating layer 123 is disposed on the second conductive layer 140. The third insulating layer 123 may be an interlayer insulating layer. The third insulating layer 123 may include an inorganic insulating material. The third insulating layer 123 may include the same material as that of the first insulating layer 121, but is not limited thereto.

The third conductive layer 150 is disposed on the third insulating layer 123. The third conductive layer 150 may include a first electrode SD1 and a second electrode SD2 of a thin film transistor of a pixel. The first electrode SD1 and the second electrode SD2 of the thin film transistor may electrically be connected to a source area and a drain area of the semiconductor layer 110 through a contact hole passing through the third insulating layer 123, the second insulating layer 122 and the first insulating layer 121. The first power voltage line ELVDDL of the pixel may be comprised of the third conductive layer 150. The first power voltage line ELVDDL may electrically be connected with the second electrode CE2 of the capacitor Cst through a contact hole passing through the third insulating layer 123.

The third conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 150 may include a plurality of deposited structures. For example, the third conductive layer 150 may be formed of a deposited structure such as Ti/Al/Ti, Mo/Al/Mo, Mo/AlGe/Mo, Ti/Cu, etc.

The fourth insulating layer 124 is disposed on the third conductive layer 150. The fourth insulating layer 124 covers the third conductive layer 150. The fourth insulating layer 124 may be a via layer. The fourth insulating layer 124 may include an organic insulating material. For example, the fourth insulating layer 124 may include a polyacrylates resin, an epoxy resin, a phenolic resin, a polyamides resin, a polyimides resin, an unsaturated polyesters resin, a poly phenylenethers resin, a polyphenylenesulfides resin or benzocyclobutene (BCB).

The fourth conductive layer 160 is disposed on the fourth insulating layer 124. The fourth conductive layer 160 may include a first anode connection electrode CNE1. The first anode connection electrode CNE1 may electrically connected with the second electrode SD2 of the thin film transistor through a contact hole passing through the fourth insulating layer 124. Through the first anode connection electrode CNE1 and the second anode connection electrode CNE2, the anode electrode ANO may electrically be connected with the second electrode SD2 of the thin film transistor. The fourth conductive layer 160 may include the same material as that of the third conductive layer 150 or include the same deposited structure as that of the third conductive layer 150, but is not limited thereto.

The fifth insulating layer 125 is disposed on the fourth conductive layer 160. The fifth insulating layer 125 covers the fourth conductive layer 160. The fifth insulating layer 125 may be a via layer. The fifth insulating layer 125 may include an organic insulating material. The fifth insulating layer 125 may include the same material as that of the fourth insulating layer 124, but is not limited thereto.

The fifth conductive layer 170 is disposed on the fifth insulating layer 125. The fifth conductive layer 170 may include a second anode connection electrode CNE2. The fifth conductive layer 170 may further include a second power voltage line ELVSSL (see FIG. 3). The second anode connection electrode CNE2 may electrically be connected with the first anode connection electrode CNE1 through a contact hole passing through the fifth insulating layer 125. The fifth conductive layer 170 may include the same material as that of the third conductive layer 150 or include the same deposited structure as that of the third conductive layer 150, but is not limited thereto.

The sixth insulating layer 126 is disposed on the fifth conductive layer 170. The sixth insulating layer 126 covers the fifth conductive layer 170. The sixth insulating layer 126 may be a via layer. The sixth insulating layer 126 may include an organic insulating material. The sixth insulating layer 126 may include the same material as that of the fourth insulating layer 24, but is not limited thereto.

The sixth conductive layer 180 is disposed on the sixth insulating layer 126. The sixth conductive layer 180 may include an anode electrode ANO. The anode electrode ANO may be a pixel electrode provided for each pixel. The anode electrode ANO may be connected to the second anode connection electrode CNE2 through a contact hole passing through the sixth insulating layer 126. The anode electrode ANO may at least partially overlap a light emitting area EMA of the pixel.

The sixth conductive layer 180 may have a deposited structure in which a layer having a high work function, such as Indium-Tin-Oxide (ITO), Indium-Zinc-Oxide (IZO), Zinc Oxide (ZnO) and Indium Oxide ($In_2O_3$), and a reflective material layer, such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture thereof, are deposited. The layer having a high work function may be disposed above the reflective material layer, and thus may be closer to the light emitting layer EML. The sixth conductive layer 180 may have a multi-layered structure of ITO/Mg, ITO/MgF, ITO/Ag, ITO/Ag/ITO, but is not limited thereto.

The pixel defining layer PDL may be disposed on the sixth conductive layer 180. The pixel defining layer PDL may include an opening that exposes the anode electrode ANO. The light emitting area EMA and a non-light emitting area NEM may be distinguished from each other by the pixel defining layer PDL and its opening. The pixel defining layer PDL may include an organic insulating material such as a polyacrylates resin, an epoxy resin, a phenolic resin, a polyamides resin, a polyimides resin, an unsaturated polyesters resin, a poly phenylenethers resin, a polyphenylenesulfides resin or benzocyclobutene (BCB). The pixel defining layer PDL may also include an inorganic material.

The light emitting layer EML is disposed on the anode electrode ANO exposed by the pixel defining layer PDL. The light emitting layer EML may include an organic material layer. The organic material layer of the light emitting layer may include an organic light emitting layer, and may further include a hole injection/transport layer and/or an electron injection/transport layer.

The cathode electrode CAT may be disposed on the light emitting layer EML. The cathode electrode CAT may be a common electrode fully disposed without distinction of the pixels. Each of the anode electrode ANO, the light emitting layer EML and the cathode electrode CAT may constitute an organic light emitting element.

The cathode electrode CAT may be in contact with the upper surface of the pixel defining layer PDL as well as the light emitting layer EML. The cathode electrode CAT may be formed to be conformal with respect to a lower structure to reflect a step difference of the lower structure.

The cathode electrode CAT may include a material layer having a low work function such as Li, Ca, LiF/Ca, LiF/Al, Al, Mg, Ag, Pt, Pd, Ni, Au Nd, Ir, Cr, BaF, Ba or their compound or mixture (e.g., mixture of Ag and Mg). The cathode electrode CAT may further include a transparent metal oxide layer disposed on the material layer having a low work function.

The encapsulation layer 190 may be disposed on the cathode electrode CAT. The encapsulation layer 190 may include a first inorganic encapsulation layer 191, an organic encapsulation layer 192 and a second inorganic encapsulation layer 193. At the end of the encapsulation layer 190, the first inorganic encapsulation layer 191 and the second inorganic encapsulation layer 193 may be in contact with each other. The organic encapsulation layer 192 may be encapsulated by the first inorganic encapsulation layer 191 and the second inorganic encapsulation layer 193.

Each of the first inorganic encapsulation layer 191 and the second inorganic encapsulation layer 193 may include an inorganic insulating material such as silicon nitride, silicon oxide or silicon oxynitride. The organic encapsulation layer 192 may include an organic insulating material.

Subsequently, a cross-sectional structure of the non-display area NDA will be described with reference to FIG. 9.

Figure 9:
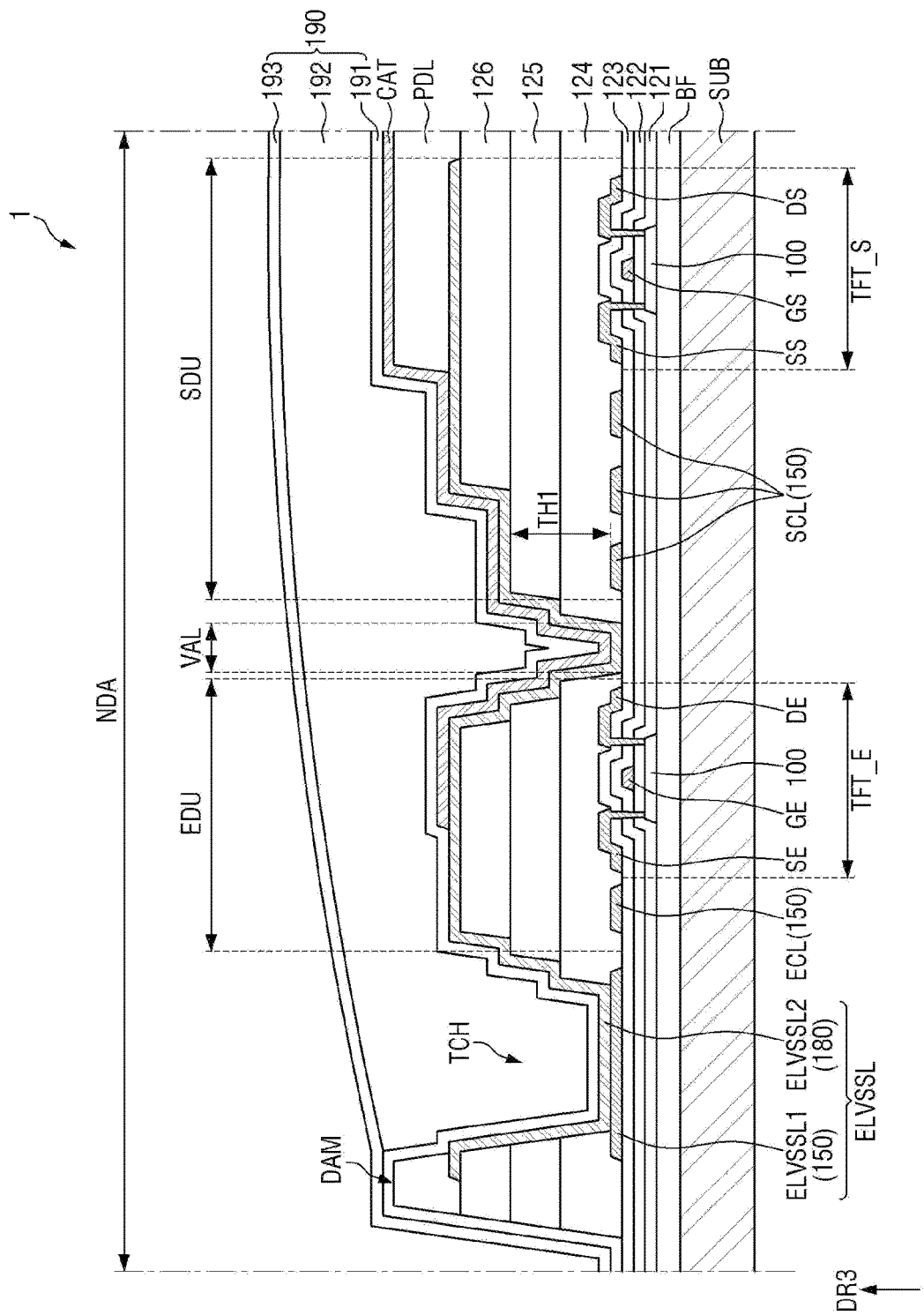
FIG. 9 is a cross-sectional view illustrating a non-display area of a display device according to one embodiment.

FIG. 9 is a cross-sectional view illustrating a non-display area of a display device according to one embodiment.

Referring to FIGS. 8 and 9, the display device 1 may further include a valley portion VAL, a dam structure DAM, and a trench TCH.

The valley portion VAL may be disposed between the scan driver SDU and the light emitting driver EDU. The valley portion VAL may be defined by an organic insulating layer. The valley portion VAL may be defined by the fourth insulating layer 124, the fifth insulating layer 125 and the sixth insulating layer 126. The valley portion VAL may pass through the fourth insulating layer 124, the fifth insulating layer 125 and the sixth insulating layer 126 in the thickness direction (third direction DR3). The valley portion VAL may expose the third insulating layer 123.

The organic insulating layer overlapped with the scan driver SDU and the organic insulating layer overlapped with the light emitting driver EDU may be separated from each other by the valley portion VAL. Therefore, out-gas generated in the area where the light emitting driver EDU is disposed may be suppressed or prevented from being diffused into the area where the scan driver SDU is disposed. Moreover, the out-gas may be suppressed or prevented from being diffused into the display area DA, whereby reliability of the display device 1 may be improved.

The dam structure DAM may be disposed outside the light emitting driver EDU. The dam structure DAM may include deposited organic insulating layers 124, 125 and 126. The trench TCH from which the organic insulating layers 124, 125 and 126 are removed may be disposed between the dam structure DAM and the light emitting driver EDU. At least a portion of the encapsulation layer 190 may be disposed in the trench TCH. For example, the organic encapsulation layer 192 of the encapsulation layer 190 may be disposed only to the dam structure DAM. That is, the organic encapsulation layer 192 of the encapsulation layer 190 may not be disposed beyond the dam structure DAM. The dam structure DAM may prevent or reduce the organic encapsulation layer 192 from overflowing to the outside of the display device 1. The first inorganic encapsulation layer 191 or the second inorganic encapsulation layer 193 of the encapsulation layer 190 may be disposed beyond the dam structure DAM.

The scan driver SDU may include at least one thin film transistor TFT_S. The thin film transistor TFT_S of the scan driver SDU may substantially be the same as one of the first pull-up transistor TU1 (FIG. 6) and the first pull-down transistor TD1 (see FIG. 6). The thin film transistor TFT_S of the scan driver SDU includes a gate electrode GS, a source electrode SS and a drain electrode DS, and the semiconductor layer 100 may include a channel of the thin film transistor TFT_S of the scan driver SDU.

The scan control line SCL may be comprised of the third conductive layer 150, but is not limited thereto. At least one of the scan control lines SCL may have a plurality of deposited structures comprised of the third conductive layer 150 and the fourth conductive layer 60.

The light emitting driver EDU may include at least one thin film transistor TFT_E. The thin film transistor TFT_E of the light emitting driver EDU may substantially be the same as one of the second pull-up transistor TU2 (see FIG. 7) and the second pull-down transistor TD2 (see FIG. 7). The thin film transistor TFT_E of the light emitting driver EDU includes a gate electrode GE, a source electrode EE and a drain electrode DE, and the semiconductor layer 100 may include a channel of the thin film transistor TFT_E of the light emitting driver EDU.

The light emitting control line ECL may be comprised of the third conductive layer 150, but is not limited thereto. At least one of the light emitting control lines ECL may have a plurality of deposited structures including the third conductive layer 150 and the fourth conductive layer 160.

The second power voltage line ELVSSL may include a first sub-power voltage line ELVSSL1 and a second sub-power voltage line ELVSSL2.

The first sub-power voltage line ELVSSL1 may be comprised of the third conductive layer 150, and may be disposed on the third insulating layer 123. In other words, the third conductive layer 150 may further include a first sub-power voltage line ELVSSL1. The first sub-power voltage line ELVSSL1 may be disposed outside the light emitting driver EDU, but is not limited thereto. The first sub-power voltage line ELVSSL1 may be exposed by the trench TCH. The first sub-power voltage line ELVSSL1 exposed by the trench TCH may physically and/or electrically be in contact with the second sub-power voltage line ELVSSL2. The first sub-power voltage line ELVSSL1 may physically and/or electrically be connected with the driving chip 20 (see FIG. 4).

The second sub-power voltage line ELVSSL2 may be comprised of the sixth conductive layer 180. In other words, the sixth conductive layer 180 may further include the second sub-power voltage line ELVSSL2. The second sub-power voltage line ELVSSL2 may physically and/or electrically be in contact with the first sub-power voltage line ELVSSL1 exposed by the trench TCH. The second sub-power voltage line ELVSSL2 may physically and/or electrically be in contact with the cathode electrode CAT. That is, the cathode electrode CAT may electrically be connected with the driving chip 20 (see FIG. 4) through the first sub-power voltage line ELVSSL1 and the second sub-power voltage line ELVSSL2.

The fourth insulating layer 124 and the fifth insulating layer 125 may overlap the scan driver SDU in the thickness direction (third direction DR3). The fourth insulating layer 124 and the fifth insulating layer 125 may overlap the plurality of scan control lines SCL in the thickness direction. Therefore, the fourth insulating layer 124 and the fifth insulating layer 125 may be disposed between the scan control line SCL, which does not overlap the sixth insulating layer 126, and the second sub-power voltage line ELVSSL2, whereby a short between the scan control line SCL, which does not overlap the sixth insulating layer 126, and the second sub-power voltage line ELVSSL2 may be suppressed or avoided.

For example, based on the thickness direction (third direction DR3), a first thickness TH1 of the fourth insulating layer 124 and the fifth insulating layer 125 between the scan control line SCL and the second sub-power voltage line ELVSSL2 may be within the range of 0.9 μm to 1.7 μm or may be 1.3 μm, but is not limited thereto. The first thickness TH1 may refer to an average thickness over the entire area, and when the first thickness TH1 is within the above range, a short between the scan control line SCL, which does not overlap the sixth insulating layer 126, and the second sub-power voltage line ELVSSL2 may be suppressed or avoided regardless of a deviation of the first thickness TH1.

In other words, when the display device 1 includes the sixth conductive layer 180, in the process of patterning the sixth conductive layer 180, the insulating layer positioned on the uppermost portion of the plurality of insulating layers in the area that is not overlapped with the sixth conductive layer 180 may partially be etched and its thickness may be reduced. However, when the plurality of scan control lines SCL overlap the fourth insulating layer 124 and the fifth insulating layer 125, the fourth insulating layer 124 and the fifth insulating layer 125 are disposed between the scan control line SCL and the second sub-power voltage line ELVSSL2. Also, even though the thickness of the fifth insulating layer 125 is reduced as the fifth insulating layer 125 is exposed by the sixth insulating layer 126, the thickness of the fourth insulating layer 24 may be maintained. Therefore, a short between the scan control line SCL, which does not overlap the sixth insulating layer 126, and the second sub-power voltage line ELVSSL2 may be suppressed or avoided. Moreover, driving of the display device 1 may be performed more actively.

Although the relationship between the organic insulating layer and the scan control line SCL has been described as above, its description may equally be applied to the relationship between the organic insulating layer and the light emitting control line ECL.

Hereinafter, other embodiments will be described. In the following embodiments, the description of the same elements as those of the previously described embodiment will be omitted or simplified for convenience of description, and the following description will be based on the difference from the previous embodiment.

Figure 10:
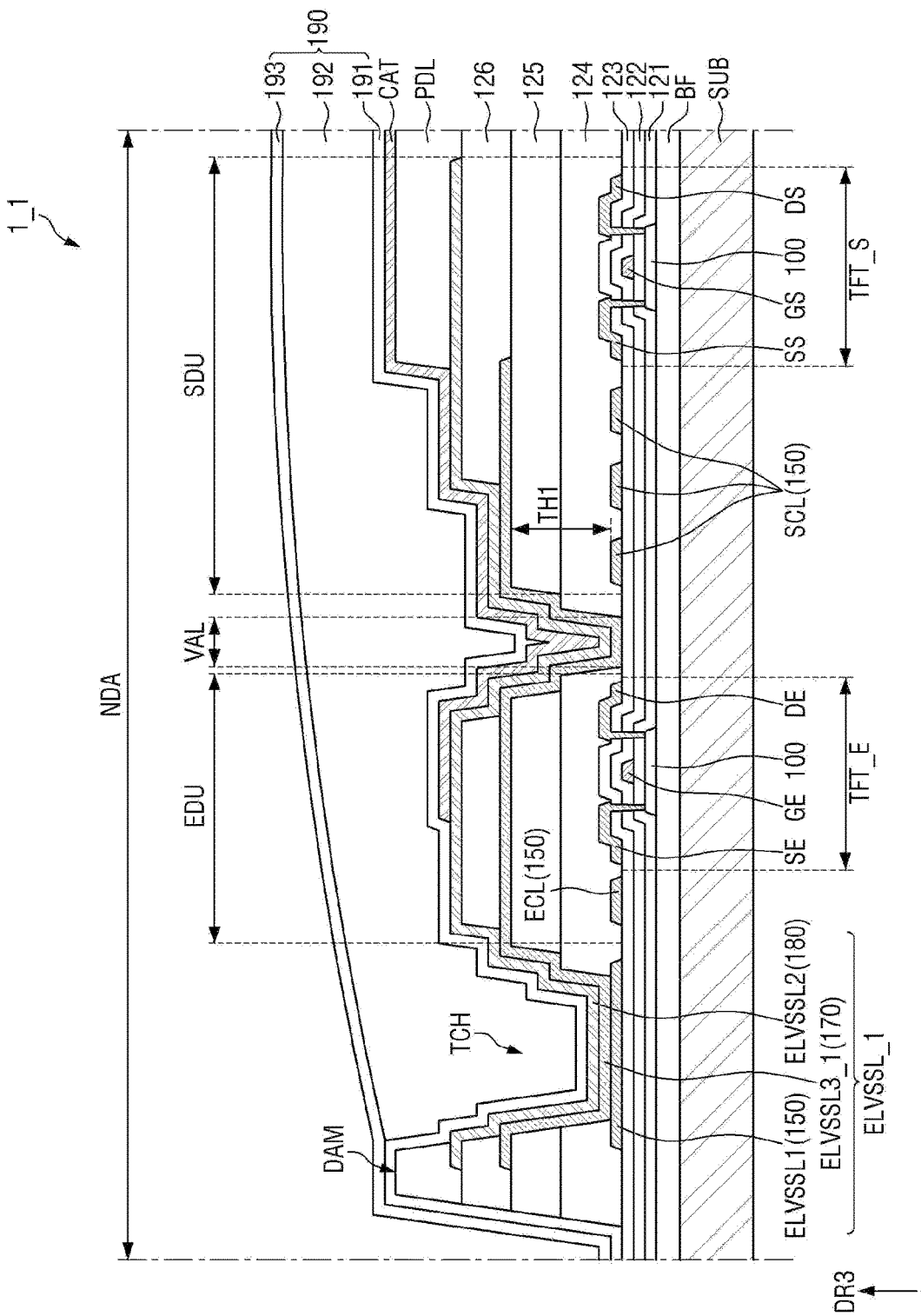
FIG. 10 is a cross-sectional view illustrating a display device according to another embodiment.

FIG. 10 is a cross-sectional view illustrating a display device according to another embodiment. FIG. 10 shows a cross-section of the non-display area NDA.

Referring to FIG. 10, the present embodiment is different from the embodiment of FIG. 9 in that a display device 1_1 further includes a third sub-power voltage line ELVSSL3_1 (etch stop pattern).

The etch stop pattern ELVSSL3_1 may be comprised of the fifth conductive layer 70. In other words, the fifth conductive layer 170 may further include the etch stop pattern ELVSSL3_1. The etch stop pattern ELVSSL3_1 may be disposed on the fifth insulating layer 25. The etch stop pattern ELVSSL3_1 may be disposed over the scan driver SDU, the valley portion VAL, the light emitting driver EDU and the trench TCH. The etch stop pattern ELVSSL3_1 may be disposed inside the valley portion VAL and the trench TCH.

The etch stop pattern ELVSSL3_1 may overlap the scan driver SDU. Based on the thickness direction, the etch stop pattern ELVSSL3_1 may be disposed between the scan control line SCL and the second sub-power voltage line ELVSSL2 to overlap the scan control line SCL and the second sub-power voltage line ELVSSL2. In other words, the etch stop pattern ELVSSL3_1 may overlap the scan control line SCL in the thickness direction, and may overlap the second sub-power voltage line ELVSSL2 in the thickness direction in the scan driver SDU.

The etch stop pattern ELVSSL3_1 may not be covered by the sixth insulating layer 126, and may cover the exposed fifth insulating layer 125. Therefore, when the display device 1_1 includes the sixth conductive layer 180, even though the sixth conductive layer 180 is patterned, etching of the fifth insulating layer 125 exposed without being covered by the sixth insulating layer 126 may be suppressed or avoided. Furthermore, the decrease in the thickness of the fifth insulating layer 125 exposed without being covered by the sixth insulating layer 126 may be suppressed or avoided, and a short between the scan control line SCL, which does not overlap the sixth insulating layer 126, and the second sub-power voltage line ELVSSL2 may be suppressed or avoided.

The second power voltage line ELVSSL_1 may further include an etch stop pattern ELVSSL3_1. In other words, when the etch stop pattern ELVSSL3_1 is disposed in the trench TCH, the first sub-power voltage line ELVSSL1 and the second sub-power voltage line ELVSSL2 may electrically be connected to each other by the etch stop pattern ELVSSL3_1. The etch stop pattern ELVSSL3_1 may be disposed between the first sub-power voltage line ELVSSL1 and the second sub-power voltage line ELVSSL2 in the trench TCH, and may physically and/or electrically be in contact with the first sub-power voltage line ELVSSL1 and the second sub-power voltage line ELVSSL2.

However, the etch stop pattern ELVSSL3_1 is not disposed in the area where the trench TCH is disposed, and the first sub-power voltage line ELVSSL1 and the second sub-power voltage line ELVSSL2 may directly be in contact witch each other. In this case, the etch stop pattern ELVSSL3_1 may be separated from the first sub-power voltage line ELVSSL1, and may electrically be insulated therefrom.

Even in this case, the fifth insulating layer 125 overlaps the plurality of scan control lines SCL in the thickness direction, whereby a short between the scan control line SCL and the second sub-power voltage line ELVSSL2 may be suppressed or avoided.

Figure 11:
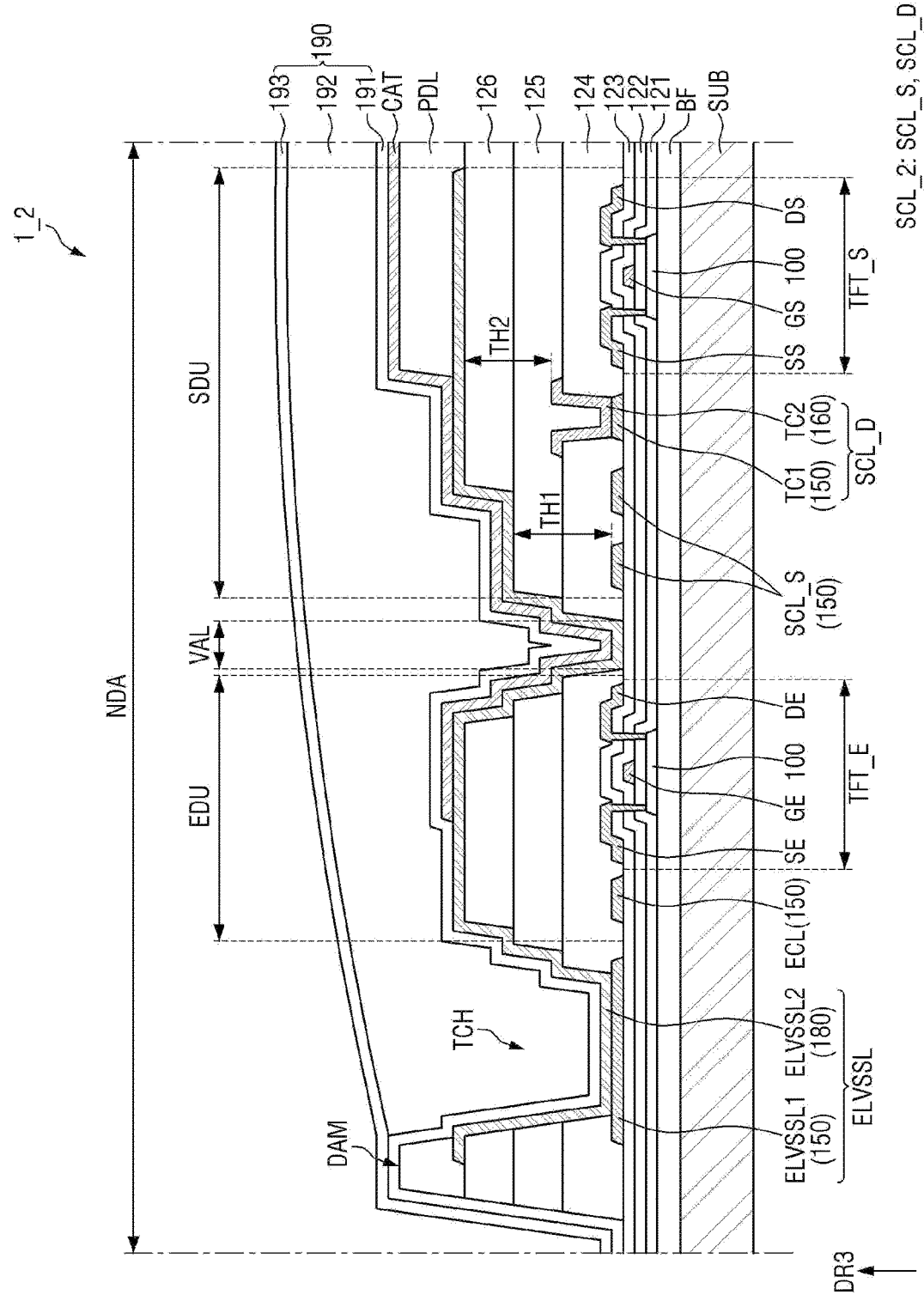
FIG. 11 is a cross-sectional view illustrating a display device according to other embodiment.

FIG. 11 is a cross-sectional view illustrating a display device according to other embodiment. FIG. 11 shows a cross-section of a non-display area NDA of a display device 1_2.

Referring to FIG. 11, the present embodiment is different from the embodiment of FIG. 9 in that at least one of scan control lines SCL_2 of the display device 12 may have a plurality of deposited structures.

The scan control line SLC_2 may include a first scan control line SCL_S comprised of the third conductive layer 150 and a second scan control line SCL_D comprised of the third conductive layer 150 and the fourth conductive layer 160. The second scan control line SCL_D may include a first deposited conductive layer TC1 and a second deposited conductive layer TC2 wherein the first deposited conductive layer TC1 may be comprised of the third conductive layer 150 and the second deposited conductive layer TC2 may be comprised of the fourth conductive layer 160. In other words, the third conductive layer 150 may include the first scan control line SCL_S and the first deposited conductive layer TC1 of the second scan control line SCL_D, and the fourth conductive layer 160 may include the second deposited conductive layer TC2 of the second scan control line SCL_D.

As the second scan control line SCL_D includes the first deposited conductive layer TC1 and the second deposited conductive layer TC2, electrical resistance of the second scan control line SCL_D may be reduced, and signal transfer may be performed more actively. For example, when the scan clock lines SCL1 and SCL2 (see FIG. 6), which are susceptible to electrical resistance, are comprised of the second scan control line SCL_D, the display device 1_2 may operate more actively.

The sixth insulating layer 126 may overlap the second scan control line SCL_D in the thickness direction. The sixth insulating layer 126 may overlap the second deposited conductive layer TC2 of the second scan control line SCL_D in the thickness direction.

For example, based on the thickness direction (third direction DR3), a second thickness TH2 of the fifth insulating layer 125 and the sixth insulating layer 126 between the second scan control line SCL_D and the second sub-power voltage line ELVSSL2 may be within the range of 0.6 μm to 1.4 μm, but is not limited thereto. The second thickness TH2 may refer to an average thickness over the entire area. When the second thickness TH2 is within the above range, even though the second scan control line SCL_D includes the first deposited conductive layer TC1 and the second deposited conductive layer TC2, a short between the second scan control line SCL_D and the second sub-power voltage line ELVSSL2 may be suppressed or avoided regardless of a deviation of the second thickness TH2.

Even in this case, the fifth insulating layer 125 overlaps all of the plurality of scan control lines SCL_2 in the thickness direction, whereby a short between the scan control line SCL_2 and the second sub-power voltage line ELVSSL2 may be suppressed or avoided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   one or more scan stages disposed on the substrate;
   a first conductive layer disposed on the substrate and including a plurality of input scan control lines electrically connected to each of the one or more scan stages;
   a first organic insulating layer disposed on the first conductive layer; and
   a second organic insulating layer disposed on the first organic insulating layer,
   wherein both the first organic insulating layer and the second organic insulating layer overlap the plurality of input scan control lines.

2. The display device of claim 1, further comprising:
   a power voltage line disposed on the second organic insulating layer and overlapping the one or more scan stages,
   wherein both the first organic insulating layer and the second organic insulating layer are disposed between the power voltage line and the one or more scan stages.

3. The display device of claim 2, wherein the first organic insulating layer and the second organic insulating layer, which are disposed between the power voltage line and the one or more scan stages, have a combined first thickness that is within a range of 0.9 μm to 1.7 μm.

4. The display device of claim 3, further comprising:
   a third organic insulating layer disposed on the second organic insulating layer; and
   an anode electrode disposed on the third organic insulating layer,
   wherein the power voltage line includes a same material as that of the anode electrode.

5. The display device of claim 4, further comprising:
   a pixel defining layer disposed on the anode electrode and exposing a portion of the anode electrode;
   a light emitting layer disposed on the portion of the anode electrode exposed by the pixel defining layer; and
   a cathode electrode disposed on the light emitting layer.

6. The display device of claim 1, further comprising:
   a second conductive layer disposed on the second organic insulating layer,
   wherein the plurality of input scan control lines comprises:
     a first input scan control line forming a first portion of the first conductive layer; and
     a second input scan control line that includes a first deposited conductive layer forming a second portion of the first conductive layer and a second deposited conductive layer forming a first portion of the second conductive layer.

7. The display device of claim 6, further comprising:
   a third organic insulating layer disposed on the second conductive layer; and
   a power voltage line disposed on the third organic insulating layer and overlapping the second input scan control line, wherein
   the third organic insulating layer overlaps the second input scan control line, and
   the second organic insulating layer and the third organic insulating layer are disposed between the power voltage line and second input scan control line.

8. The display device of claim 7, wherein the second organic insulating layer and the third organic insulating layer, which are disposed between the power voltage line and the second scan control line, have a combined second thickness that is within a range of 0.6 μm to 1.4 μm.

9. The display device of claim 1, further comprising:
   a display area that displays an image; and
   a non-display area disposed along a periphery of the display area,
   wherein the one or more scan stages and the plurality of input scan control lines are disposed in the non-display area.

10. The display device of claim 9, further comprising:
    a driving chip disposed in the non-display area,
    wherein the driving chip is electrically connected to the one or more scan stages through the plurality of input scan control lines.

11. The display device of claim 1, further comprising:
    a dam structure disposed on the substrate, wherein
    in a plan view, the plurality of input scan control lines are disposed between the dam structure and the one or more scan stages, and
    the dam structure includes respective portions of the first organic insulating layer and the second organic insulating layer.

12. The display device of claim 1, further comprising:
    light emitting stages disposed on the substrate; and
    a plurality of light emitting control lines electrically connected to each of the light emitting stages.

13. The display device of claim 12, further comprising:
    a valley portion disposed between the one or more scan stages and the plurality of scan control lines adjacent to a first side of the valley portion and the light emitting stages and light emitting control lines adjacent to a second side of the valley portion opposing the first side of the valley portion, the valley portion being at least partially defined by the first organic insulating layer and the second organic insulating layer.

14. The display device of claim 13, wherein the valley portion passes through the first organic insulating layer and the second organic insulating layer in a thickness direction.

15. A display device comprising:
a substrate:
one or more scan stages disposed on the substrate;
a first conductive layer disposed on the substrate and including a plurality of scan control lines electrically connected to each of the one or more scan stages;
a first organic insulating layer disposed on the first conductive layer;
a second organic insulating layer disposed on the first organic insulating layer;
an etch stop pattern disposed on the second organic insulating layer and overlapping the plurality of scan control lines;
a third organic insulating layer disposed on the etch stop pattern; and
a first sub-power voltage line disposed on the third organic insulating layer and overlapping the plurality of scan control lines,
wherein both the first organic insulating layer and the second organic insulating layer overlap the plurality of scan control lines.

16. The display device of claim 15, wherein
the first conductive layer further includes a second sub-power voltage line, and
both the first sub-power voltage line and the second sub-power voltage line are electrically connected to each other through the etch stop pattern.

17. A display device comprising:
a display area;
a pixel defining layer disposed in the display area;
a scan driver disposed outside the display area, the scan driver including one or more scan stages and a plurality of input scan control lines electrically connected to each of the one or more scan stages;
a first organic insulating layer disposed on the plurality of input scan control lines;
a second organic insulating layer disposed on the first organic insulating layer and overlapping the plurality of input scan control lines;
a third organic insulating layer disposed on the second organic insulating layer and overlapping some of the plurality of input scan control lines, but less than all of the plurality of input scan control lines; and
a power voltage line disposed on each of the first organic insulating layer, the second organic insulating layer, and the third organic insulating layer.

18. The display device of claim 17, wherein the first organic insulating layer and the second organic insulating layer, which are disposed between the power voltage line and the plurality of input scan control lines, have a first thickness that is within a range of 0.9 μm to 1.7 μm.

19. The display device of claim 18, further comprising:
an anode electrode disposed on the third organic insulating layer, wherein
the power voltage line includes a same material as that of the anode electrode, and
a portion of the power voltage line is disposed between the pixel defining layer and the third organic insulating layer.

20. The display device of claim 19, further comprising:
an opening in the pixel defining layer and exposing a portion of the anode electrode;
a light emitting layer disposed on the portion of the anode electrode exposed by the opening in the pixel defining layer; and
a cathode electrode disposed on the light emitting layer and electrically connected to the power voltage line.

21. An electronic device comprising:
a substrate;
one or more scan stages disposed on the substrate;
a first conductive layer disposed on the substrate and including a plurality of input scan control lines electrically connected to each of the one or more scan stages;
a first organic insulating layer disposed on the first conductive layer; and
a second organic insulating layer disposed on the first organic insulating layer,
wherein both the first organic insulating layer and the second organic insulating layer overlap the plurality of input scan control lines.

* * * * *